(12) United States Patent
Raj et al.

(10) Patent No.: US 9,608,644 B1
(45) Date of Patent: Mar. 28, 2017

(54) PHASE-LOCKED LOOP HAVING SUB-SAMPLING PHASE DETECTOR

(71) Applicant: Xilinx, Inc., San Jose, CA (US)

(72) Inventors: Mayank Raj, San Jose, CA (US); Parag Upadhyaya, Los Gatos, CA (US); Adebabay M. Bekele, San Jose, CA (US)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 15/172,442

(22) Filed: Jun. 3, 2016

(51) Int. Cl.
*H03L 7/06* (2006.01)
*H03L 7/087* (2006.01)

(52) U.S. Cl.
CPC .................................... *H03L 7/087* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 5,552,727 A * | 9/1996 | Nakao | ..................... | H03L 7/189 327/105 |
| 8,816,776 B2 * | 8/2014 | Sindalovsky | ........... | H03L 7/095 327/141 |
| 8,928,375 B2 * | 1/2015 | Canard | ................... | H03L 7/095 327/147 |
| 2004/0207437 A1 * | 10/2004 | Shibahara | ............ | H03C 3/0925 327/156 |
| 2013/0005276 A1 * | 1/2013 | Van Driest | .............. | H03L 7/091 455/76 |
| 2013/0156076 A1 * | 6/2013 | Kinget | ..................... | H04L 27/18 375/219 |
| 2014/0285245 A1 * | 9/2014 | Sahara | ...................... | H03L 7/08 327/147 |
| 2014/0320181 A1 * | 10/2014 | Mitric | ....................... | H03L 7/10 327/156 |
| 2016/0226656 A1 * | 8/2016 | Okada | ................... | H04L 7/0331 |

OTHER PUBLICATIONS

Gao, Xiang et al., "A Low Noise Sub-Sampling PLL in Which Divider Noise is Eliminated and PD/CP Noise is Not Multiplied by N2," IEEE Journal of Solid-State Circuits, Dec. 2009, pp. 3253-3263, vol. 44, No. 12, IEEE, Piscataway, New Jersey, USA.

(Continued)

*Primary Examiner* — Adam Houston
(74) *Attorney, Agent, or Firm* — Robert M. Brush

(57) ABSTRACT

An example phase-locked loop (PLL) circuit includes a voltage controlled oscillator (VCO) configured to generate an output clock based on an oscillator control voltage, a sub-sampling phase detector configured to receive a reference clock and the output clock, and a phase frequency detector configured to receive the reference clock and a feedback clock. The PLL circuit includes a charge pump configured to generate a charge pump current, a multiplexer circuit configured to select either output of the sub-sampling phase detector or output of the phase frequency detector to control the charge pump, and a lock detector configured to receive the reference clock, the feedback clock, and the output of the phase frequency detector to control the multiplexer. The PLL circuit includes a loop filter configured to filter the charge pump current and generate the oscillator control voltage, and a frequency divider configured to generate the reference clock from the output clock.

20 Claims, 5 Drawing Sheets

(56) References Cited

OTHER PUBLICATIONS

Hsu, Chun-Wei et al., "A 2.2GHz PLL using a Phase-Frequency Detector with an Auxiliary Sub-Sampling Phase Detector for In-Band Noise Suppression," Proc. of the 2011 IEEE Custom Integrated Circuits Conference, Sep. 19, 2011, pp. 1-4, IEEE, Piscataway, New Jersey, USA.

* cited by examiner

PHASE-LOCKED LOOP HAVING SUB-SAMPLING PHASE DETECTOR

TECHNICAL FIELD

Examples of the present disclosure generally relate to electronic circuits and, in particular, to a phase-locked loop (PLL) having a sub-sampling phase detector.

BACKGROUND

The in-band jitter contribution of a phase-locked loop (PLL) is dominated by phase detector and charge pump noise. This jitter contribution is reduced by increasing the effective gain of the phase detector and the charge pump. The effective gain can be increased by increasing charge pump current. However, increasing charge pump current results in higher power consumption and higher output noise. Additionally, the charge pump current cannot be increased arbitrarily due to saturation margin limits of the current sources, particularly in scaled processes with lower-voltage power supplies. Thus, it is desirable to increase the effective gain without increasing the charge pump current.

SUMMARY

Techniques for providing a phase-locked loop (PLL) having a sub-sampling phase detector are described. In an example, a phase-locked loop (PLL) circuit includes a voltage controlled oscillator (VCO) configured to generate an output clock based on an oscillator control voltage, a sub-sampling phase detector configured to receive a reference clock and the output clock, and a phase frequency detector configured to receive the reference clock and a feedback clock. The PLL circuit further includes a charge pump configured to generate a charge pump current, a multiplexer circuit configured to select either output of the sub-sampling phase detector or output of the phase frequency detector to control the charge pump, and a lock detector configured to receive the reference clock, the feedback clock, and the output of the phase frequency detector to control the multiplexer. The PLL circuit further includes a loop filter configured to filter the charge pump current and generate the oscillator control voltage, and a frequency divider configured to generate the reference clock from the output clock.

In another example, a phase-locked loop (PLL) circuit includes a charge pump, a loop filter coupled to an output of the charge pump, a voltage controlled oscillator (VCO) coupled to the output of the charge pump, a frequency divider coupled to an output of the VCO, a sub-sampling phase detector coupled to the output of the VCO, and a phase frequency detector coupled to the output of the VCO and an output of the divider. The PLL circuit further includes a multiplexer circuit coupled between outputs of the sub-sampling phase detector and the phase frequency detector and an input of the charge pump, and a lock detector coupled to the output of the phase frequency detector and a control input of the multiplexer.

In another example, a method of operating a phase lock loop (PLL) circuit includes filtering output of a charge pump to control a voltage controlled oscillator (VCO), generating first charge pump control signals using a phase frequency detector based on a frequency divided output of the VCO and a reference clock, and generating second charge pump control signals using a sub-sampling phase detector based on output of the VCO and the reference clock. The method further includes controlling the charge pump using the first control signals in a first mode, and controlling the charge pump using the second control signals in a second mode after the first mode.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
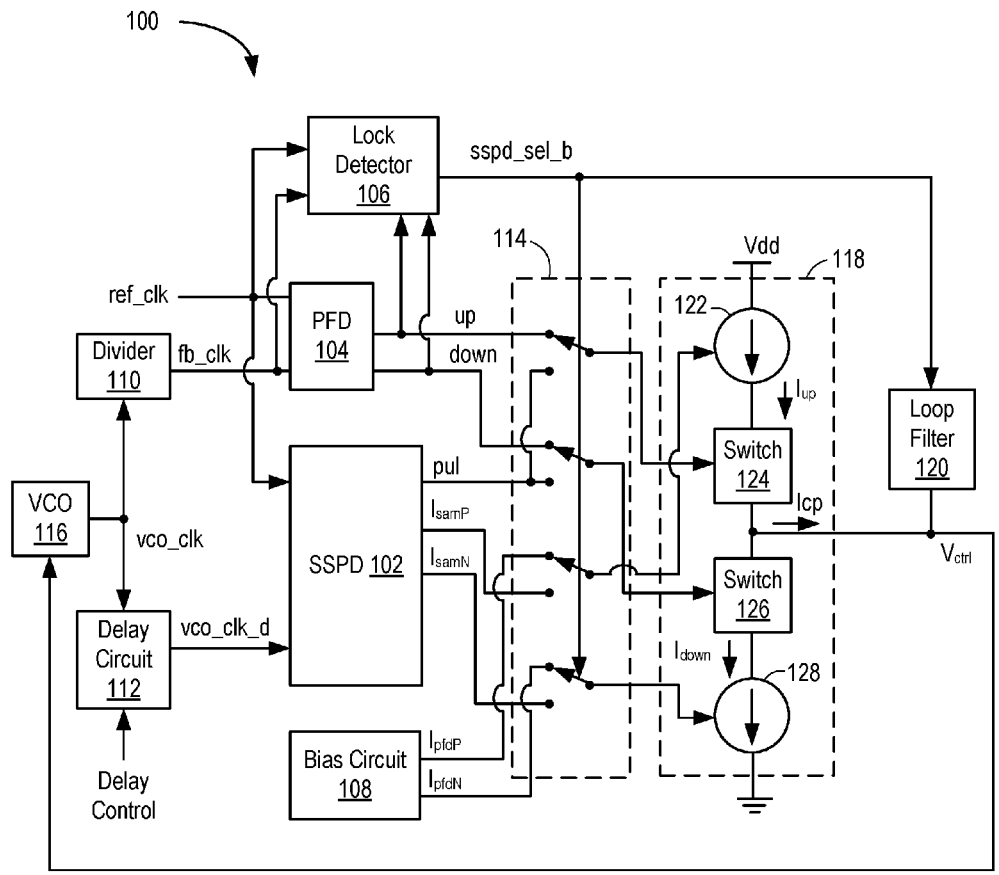
FIG. 1 is a block diagram depicting a phase-locked loop (PLL) according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

Techniques for providing a phase-locked loop (PLL) having a sub-sampling phase detector are described. As discussed above, the in-band jitter contribution of a PLL is reduced by increasing the effective gain of the phase detector and the charge pump. Sub-sampling PLLs require additional frequency acquisition due to their small locking range (e.g., typically ~10 MHz). One technique to resolve this issue uses a secondary frequency look loop (FLL). This can be implemented using a phase-frequency detector (PFD) with a dead zone. When the phase between a reference clock and a feedback clock are within this dead zone, the sub-sampling phase detector (SSPD) is one and the PFD is disabled. A problem with this technique is that for the system to acquire phase lock, the SSPD loop itself must have a locking range of the reference frequency divided by two, which can be difficult to achieve given process and temperature variations (PVT). Another technique to provide additional frequency acquisition to sub-sampling PLLs employs SSPD and PFD loops concurrently (e.g., both loops are active at the same time). Unfortunately, when both loops are concurrently active, the loops can fight each other, which leads to large periodic jitter due to mismatch between the two loops. Additionally, the overall in-band phase noise is higher than the SSPD by itself. Finally, with both techniques described above, the sub-sampling PLL requires two charge pumps, which requires more implementation area and increased power consumption.

In an example, a PLL is described herein that solves the frequency acquisition problem while maintaining good noise performance of a sub-sampling phase detector. The PLL includes a lock detect circuit that determines if the PLL is close to lock based on the pulse width of up and down control signals generated by a PFD. If the pulse width is small enough, then the SSPD loop is activated and the PFD loop is disabled. If the pulse width is large enough, then the PFD loop is activated and the SSPD loop is disabled. This allows the PLL to use a single charge pump, which saves implementation area and reduced power consumption as compared to the techniques described above. These and other aspects are described below with respect to the drawings.

FIG. 1 is a block diagram depicting a PLL 100 according to an example. The PLL 100 includes a sub-sampling phase detector (SSPD) 102, a phase-frequency detector (PFD) 104, a lock detector 106, a bias circuit 108, a frequency divider ("divider 110"), a delay circuit 112, a multiplexer circuit 114, a voltage controlled oscillator (VCO) 116, a charge pump 118, and a loop filter 120. In the example, the charge pump 118 includes a current source 122, switches 124 and 126, and a current source 128. The current sources 122 and 128 can be any know circuits for implementing current-controlled current sources. The switches 124 and 126 can be any known circuits for implementing voltage-controlled switches.

The PFD 104 includes a pair of inputs configured to receive a reference clock (ref_clk) and a feedback clock (fb_clk), respectively. The PFD 104 includes a pair of outputs supplying an up signal and a down signal, respectively. The outputs of the PFD 104 are coupled to respective inputs of the multiplexer circuit 114. The outputs of the PFD 104 are also coupled to respective inputs of the lock detector 106. The lock detector 106 includes another pair of inputs configured to receive the reference clock and the feedback clock, respectively. An output of the lock detector 106 provides a control signal, designated sspd_sel_b. The output of the lock detector 106 is coupled to a control input of the multiplexer circuit 114.

The SSPD 102 includes a pair of inputs configured to receive the reference clock and a delayed VCO clock (vco_clk_d). Outputs of the SSPD 102 supply a pulse signal (pul) and a differential current having a positive end ($I_{samP}$) and a negative end ($I_{samN}$). The outputs of the SSPD 102 are coupled to inputs of the multiplexer circuit 114. The bias circuit 108 includes a pair of outputs coupled to inputs of the multiplexer circuit 114. The outputs of the bias circuit 108 provide a differential current having a positive end ($I_{pfdP}$) and a negative end ($I_{pfdN}$).

The multiplexer circuit 114 includes outputs coupled to inputs of the charge pump 118. In particular, two outputs of the multiplexer circuit 114 are coupled to control inputs of the current sources 122 and 128. Another two outputs of the multiplexer circuit 114 are coupled to control inputs of the switches 124 and 126. The charge pump 118 includes an output that supplies a charge pump current Icp. The charge pump current Icp is filtered by the loop filter 120 to generate a control voltage $V_{ctrl}$. An input of the VCO 116 receives the control voltage $V_{ctrl}$. An output of the VCO 116 is coupled to an input of each of the divider 110 and the delay circuit 112. The output of the VCO 116 provides a clock signal, referred to as vco_clk. An output of the divider 110 provides the feedback clock (fb_clk). An output of the delay circuit 112 provides the delayed VCO clock (vco_clk_d). The VCO 116 can be an inductor-capacitor (LC) oscillator, ring oscillator, or the like. The divider 110 can be an integer divider (e.g., divide by N) or fractional divider (e.g., divide by N.F).

In operation, the lock detector 106 determines whether the PLL 100 is close to lock based on the pulse width of the up and down signals generated by the PFD 104. If the pulse widths satisfy a lock threshold, then the control signal sspd_sel_b transitions to a logic '0'. If the pulse widths do not satisfy the lock threshold, then the control signal sspd_sel_b transitions to a logic '1'. The multiplexer circuit 114 includes a bank of switches that changes state based on the control signal sspd_sel_b.

When the control signal sspd_sel_b is a logic '1' (e.g., the pulse widths of the up and down signals do not satisfy the lock threshold), the multiplexer circuit 214 selects the up and down signals and the differential current output by the bias circuit 108. The multiplexer circuit 214 couples the up and down signals to control the switches 124 and 126, respectively, in the charge pump 118. The multiplexer circuit 214 couples the current $I_{pfdP}$ to control the current source 122 and the current $I_{pfdN}$ to control the current source 128. Thus, when PLL is not close to lock, the multiplexer circuit 214 selects the PFD 104 to control the charge pump 118.

When the control signal sspd_sel_b is a logic '0' (e.g., the pulse widths of the up and down signals do satisfy the lock threshold), the multiplexer circuit 214 selects the differential current output by the SSPD 102 and the pulse signal (pul). The multiplexer circuit 214 couples the pulse signal (pul) to control each of the switches 124 and 126. The multiplexer circuit 214 couples the current $I_{samP}$ to control the current source 122 and the current $I_{samN}$ to control the current source 128. Thus, when the PLL is close to lock, the multiplexer circuit 214 selects the SSPD 102 to control the charge pump 118.

Using the multiplexer circuit 214 to select either the PFD 104 or the SSPD 102 based on lock state of the PLL 100 allows for use of a single charge pump 118, which saves power and implementation area. Because only one of the SSPD 102 or the PFD 104 is "on" at one time, there is no periodic jitter addition in contrast to an approach where both SSPD and PFD loops are active at the same time.

Figure 2:
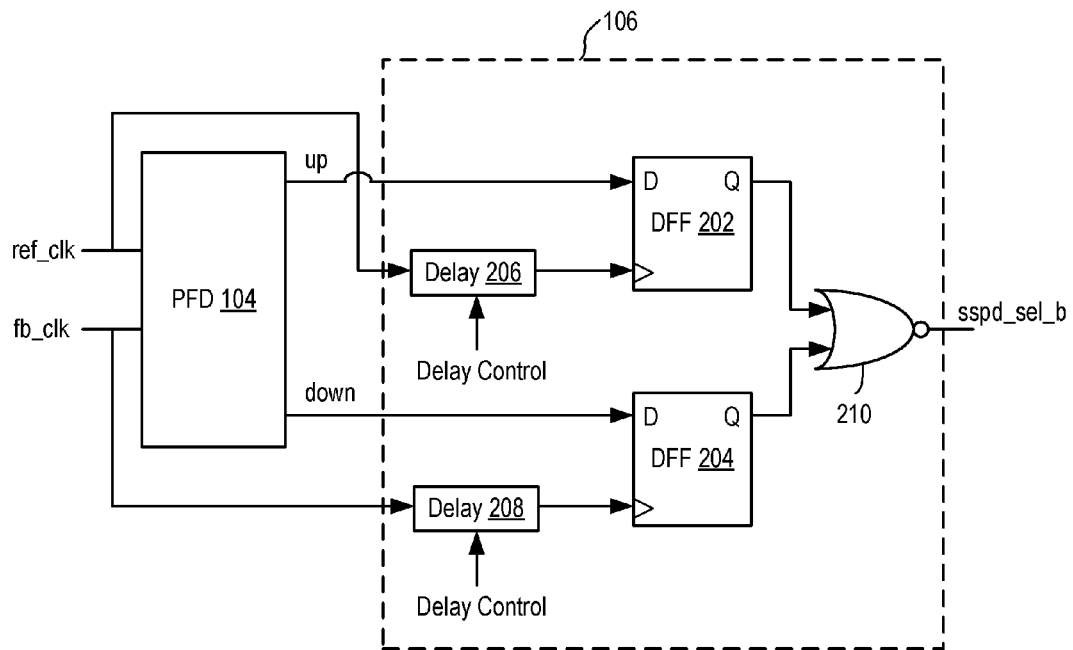
FIG. 2 is a block diagram depicting a lock detector according to an example.

FIG. 2 is a block diagram depicting the lock detector 106 according to an example. The lock detector 106 includes a D flip-flop (DFF) 202, a DFF 204, delay circuits 206 and 208, and a logic gate 210 configured to implement a NOR logic function (e.g., a NOR gate). An input of the delay circuit 206 is coupled to receive the reference clock (ref_clk). An output of the delay circuit 206 is coupled to a clock input of the DFF 202. A data input (D) of the DFF 202 is coupled to receive the up signal from the PFD 104. An input of the delay circuit 208 is coupled to receive the feedback clock (fb_clk). An output of the delay circuit 208 is coupled to a clock input of the DFF 204. A data input (D) of the DFF 204 is coupled to receive the down signal from the PFD 104. Outputs (Q) of the DFFs 202 and 204 are coupled to inputs of the logic gate 210. An output of the logic gate 210 supplies the sspd_sel_b control signal.

In operation, the delay circuit 206 delays the reference clock by a variable amount set by a delay control input of the delay circuit 206. The delay circuit 208 delays the feedback clock by a variable amount set by a delay control input of the delay circuit 208. The DFF 202 samples the up signal based on the delayed reference clock. The DFF 204 samples the down signal based on the delayed feedback clock. If both the DFF 202 and the DFF 204 sample a logic '1', the sspd_sel_b is a logic '1' and the multiplexer circuit 114 selects the PFD path. That is, when both the DFF 202 and the DFF 204 sample a logic '1', the lock threshold is not satisfied. If the logic values sampled by the DFFs 202 and 204 differ, then the sspd_sel_b is a logic '0' and the multiplexer circuit 114 selects the SSPD path. That is, when both the DFF 202 and the DFF 204 sample different logic values, the lock threshold is satisfied.

Figure 3:
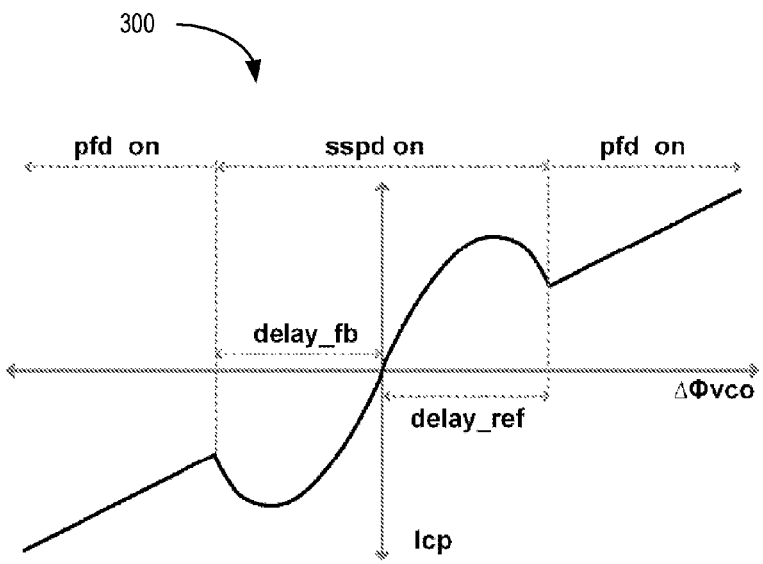
FIG. 3 is a graph depicting a transfer function according to an example.

FIG. 3 is a graph 300 depicting an SSPD/charge pump transfer function according to an example. The graph 300 includes an X-axis representing the phase difference between reference and feedback clocks and a Y-axis representing magnitude of the charge pump current Icp. When the phase difference is closer to zero, the SSPD path is active. Otherwise, the PFD path is active. The delay provided by the delay circuits 206 and 208 in the lock detector 106 controls the shape of the transfer function within the SSPD range. The delay supplied the delay circuit 206 (delay_ref) is used to control how far (based on locking range of the SSPD 102) the SSPD 102 will be 'on' if the VCO phase leads the reference. The delay supplied by the delay circuit 208 (delay_fb) is used to control how far the SSPD 102 will be 'on' if the VCO phase lags the reference. Beyond delay_ref (on the right) and delay_fb (on the left), the PFD loop is active, which provides frequency acquisition. Referring to FIG. 2, the delay circuit 112 is used to provide a variable delay to the VCO clock supplied to the SSPD 102. The delay supplied by the delay circuit 112 is used to match the divider 110 delay to insure symmetry (left and right) in the transfer function shown in FIG. 3. Configurability of delay_ref, delay_fb, and the delay supplied by the delay circuit 112 allows for robust frequency acquisition as compared a PLL that uses a dedicated frequency lock loop.

Figure 4:
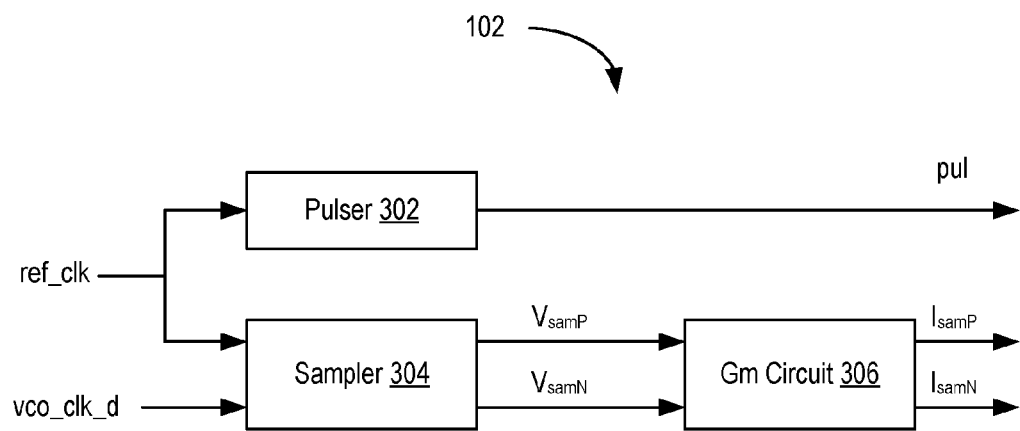
FIG. 4 is a block diagram depicting a sub-sampling phase detector (SSPD) according to an example.

FIG. 4 is a block diagram depicting the SSPD 102 according to an example. The SSPD 102 includes a pulser circuit ("pulser 302"), a sampler 304, and a transconductance (Gm) circuit 306. The sampler 304 includes a pair of inputs configured to receive the reference clock (ref_clk) and the delayed VCO clock (vco_clk_d), respectively. The sampler 304 includes a pair of outputs coupled to a pair of inputs of the Gm circuit 306. The outputs of the sampler 304 supply a differential voltage having a positive end ($V_{samP}$) and a negative end ($V_{samN}$). The Gm circuit 306 includes a pair of outputs that supply a differential current having a positive end ($I_{samP}$) and a negative end ($I_{samN}$). An input of the pulser 302 is configured to receive the reference clock. An output of the pulser 302 supplies the pulse signal (pul).

In operation, the sampler 304 samples the delayed VCO clock using the reference clock. The differential voltage output by the sampler 304 contains the phase error information (e.g., the phase error between the VCO clock and the reference clock). The Gm circuit 306 converts the differential voltage output by the sampler 304 into a differential current. When the SSPD loop is active, the differential current is supplied to the charge pump 118, which controls the $I_{up}$ and $I_{down}$ currents supplied by the current sources 122 and 128 for phase locking. When the SSPD loop is active, the pulser 302 controls the switches 124 and 126 to be on or off concurrently, with the duration of the on state of the switches 124 and 126 being determined by the pulse width. The output current Icp is thus $I_{up}$-$I_{down}$ or zero depending on whether the switches 124 and 126 are closed or open, respectively. The single-ended output current Icp of the charge pump is filtered by the loop filter 120, which generates the control voltage Vctrl for the VCO 116. While the charge pump 118 is shown as supplying a single-ended output, in other examples, the charge pump 118 can have a differential output. Further, in other examples, the number of branches in the charge pump 118 can be changed to increase or decrease the charge pump current.

Figure 5:
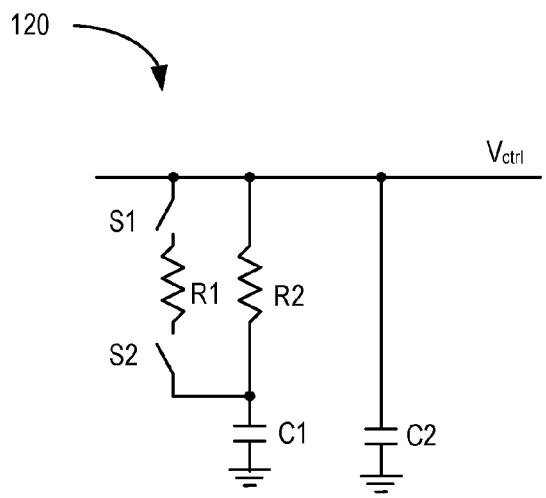
FIG. 5 is a schematic diagram depicting a loop filter according to an example.

FIG. 5 is a schematic diagram depicting the loop filter 120 according to an example. The loop filter 120 includes resistors R1 and R2 and capacitors C1 and C2. The resistor R2 is coupled in series with the capacitor C1. The series combination of the resistor R2 and the capacitor C1 is coupled between the node $V_{ctrl}$ and a reference voltage, such as electrical ground. The capacitor C2 is coupled between the node $V_{ctrl}$ and the reference voltage (in parallel with the series combination of R2 and C1). The resistor R2 is switchably coupled in parallel with the resistor R1 by switches S1 and S2. Thus, the resistance coupled between the node $V_{ctrl}$ and the capacitor C1 can be R2 or the parallel combination of R1 and R2. The switches S1 and S2 can be controlled by the sspd_sel_b control signal output by the lock detector 106. In this manner, the filter resistance can be changed between the SSPD mode and the PFD mode. When the SSPD loop is active, the filter resistance is reduced because of the high loop gain of the SSPD 102. When the PFD loop is active, the filter resistance is increased to ensure good damping.

Figure 6:
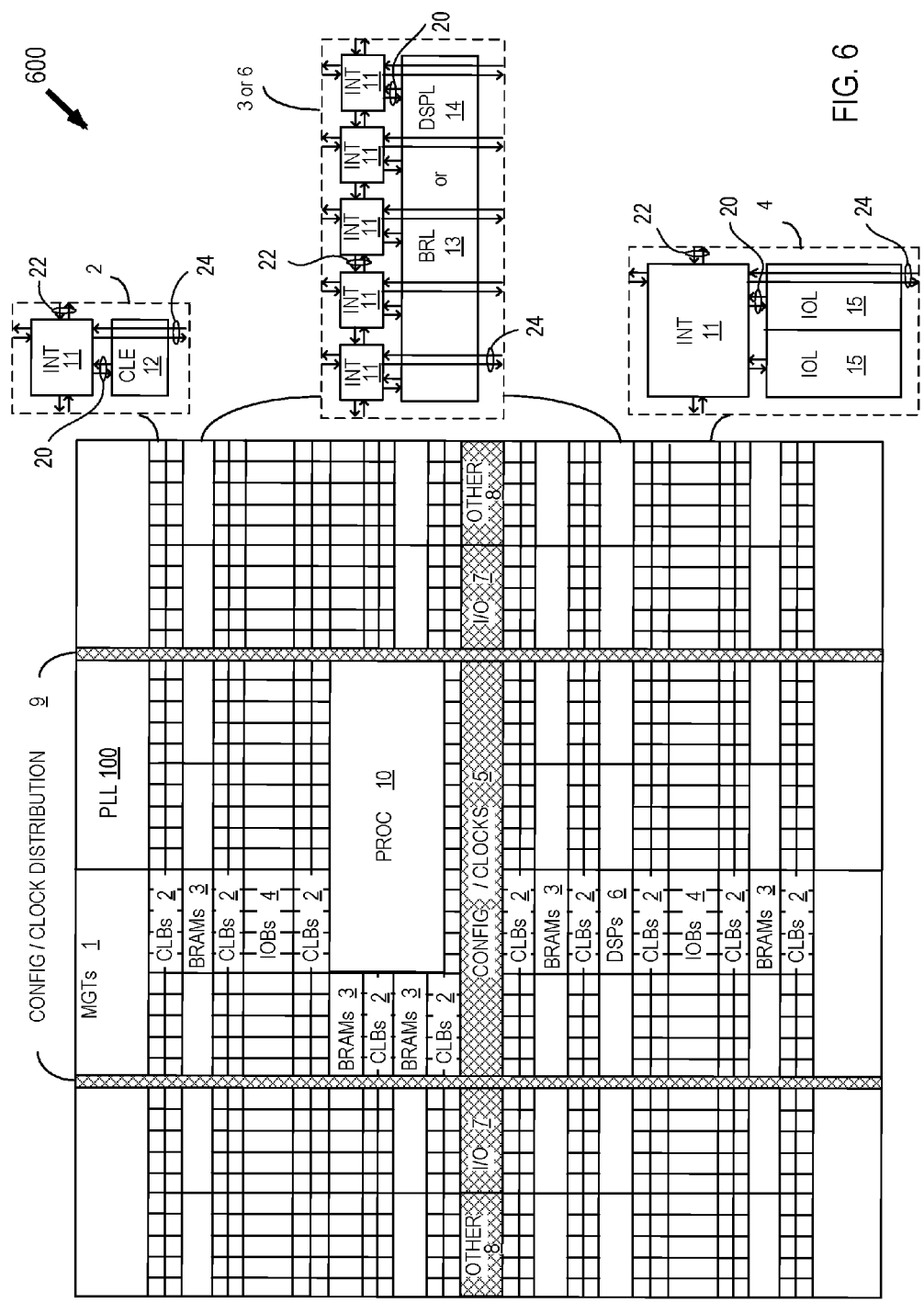
FIG. 6 illustrates an architecture of a programmable integrated circuit in which the PLL of FIG. 1 can be employed.

The PLL 100 described herein can be used in receivers or transceivers disposed in an IC, such as a field programmable gate array (FPGA) or other type of programmable IC or in an application specific integrated circuit (ASIC). Although an FPGA is shown by way of example, it is to be understood that the PLL 100 can be implemented in other types of ICs or applications. FIG. 6 illustrates an architecture of an FPGA 600 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("VI/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10.

In some FPGAs, each programmable tile can include at least one programmable interconnect element ("INT") 11 having connections to input and output terminals 20 of a programmable logic element within the same tile, as shown by examples included at the top of FIG. 11. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An IOB 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 11) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 7:
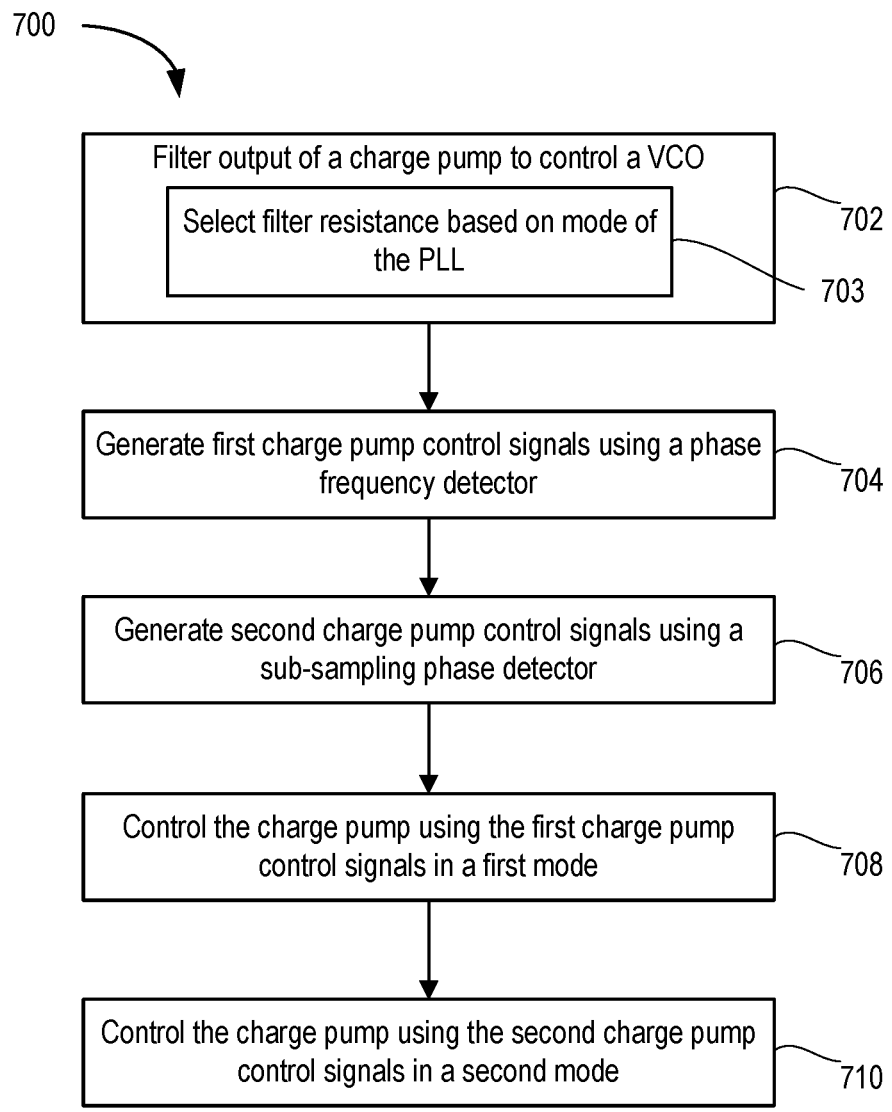
FIG. 7 is a flow diagram depicting a method of operating a PLL circuit according to an example.

FIG. 7 is a flow diagram depicting a method 700 of operating the PLL 100 according to an example. The method 700 begins at step 702, where the output of the charge pump 118 is filtered (e.g., by the loop filter 120) to control the VCO 116. At step 704, the PFD 104 generates first charge pump control signals (e.g., the up and down signals). At step 706, the SSPD 102 generates second charge pump control signals (e.g., the pulse signal and the differential current). At step 708, the lock detector 106 controls the multiplexer circuit 114 to control the charge pump 118 using the first charge pump control signals from the PFD 104 in a first mode. At step 710, the lock detector 106 controls the multiplexer circuit 114 to control the charge pump 118 using the second charge pump control signals from the SSPD 102 in a second mode after the first mode. In an example, at step 703, the lock detector 106 selects a resistance in the loop filter 120 based on the mode of the PLL.

While the foregoing is directed to specific examples, other and further examples may be devised without departing from the basic scope thereof, and the scope thereof is determined by the claims that follow.

What is claimed is:

1. A phase-locked loop (PLL) circuit, comprising:
   a voltage controlled oscillator (VCO) configured to generate an output clock based on an oscillator control voltage;
   a sub-sampling phase detector configured to receive a reference clock and the output clock;
   a phase frequency detector configured to receive the reference clock and a feedback clock;
   a charge pump configured to generate a charge pump current;
   a multiplexer circuit configured to select either output of the sub-sampling phase detector or output of the phase frequency detector to control the charge pump;
   a lock detector configured to receive the reference clock, the feedback clock, and the output of the phase frequency detector to control the multiplexer circuit;
   a loop filter configured to filter the charge pump current and generate the oscillator control voltage; and
   a frequency divider configured to generate the reference clock from the output clock.

2. The PLL circuit of claim 1, wherein the output of the sub-sampling phase detector comprises a differential current configured to control current sources in the charge pump and a pulse signal configured to control switches in the charge pump.

3. The PLL circuit of claim 1, wherein the output of the phase frequency detector comprises up and down signals configured to control switches in the charge pump.

4. The PLL circuit of claim 3, further comprising:
   a bias circuit configured to provide a fixed differential current to control current sources in the charge pump.

5. The PLL circuit of claim 1, further comprising:
   a delay circuit configured to delay the output clock received by the sub-sampling phase detector.

6. The PLL circuit of claim 1, wherein the output of the phase frequency detector comprises up and down signals, and wherein the lock detector comprises:
   a first delay circuit configured to delay the reference clock;
   a second delay circuit configured to delay the feedback clock;
   a first flip-flop configured to sample the up signal based on a delayed reference clock supplied by the first delay circuit;
   a second flip-flop configured to sample the down signal based on a delayed feedback clock supplied by the second delay circuit; and
   a logic gate configured to logically NOR outputs of the first flip-flop and the second flip-flop to generate a control signal to control the multiplexer circuit.

7. The PLL circuit of claim 1, wherein the sub-sampling phase detector comprises:
   a pulser configured to receive the reference clock and to generate a pulse signal to control switches in the charge pump;
   a sampler configured to receive the reference clock and the output clock and to generate a differential voltage; and a transconductance circuit configured to receive the differential voltage and to generate a differential current to control current sources in the charge pump.

8. The PLL circuit of claim 1, wherein the loop filter comprises:
a first resistor coupled in series with a first capacitor;
a second capacitor coupled in parallel with the series combination of the first resistor and the first capacitor; and
a second resistor selectively coupled in parallel with the first resistor by a pair of switches;
wherein the lock detector is configured to control the pair of switches.

9. A phase-locked loop (PLL) circuit, comprising:
a charge pump;
a loop filter coupled to an output of the charge pump;
a voltage controlled oscillator (VCO) coupled to the output of the charge pump;
a frequency divider coupled to an output of the VCO;
a sub-sampling phase detector coupled to the output of the VCO;
a phase frequency detector coupled to the output of the VCO and an output of the divider;
a multiplexer circuit coupled between outputs of the sub-sampling phase detector and the phase frequency detector and an input of the charge pump; and
a lock detector coupled to the output of the phase frequency detector and a control input of the multiplexer circuit.

10. The PLL circuit of claim 9, further comprising:
a bias circuit coupled to an input of the multiplexer circuit.

11. The PLL circuit of claim 9, further comprising:
a delay circuit coupled between the output of the VCO and an input of the sub-sampling phase detector.

12. The PLL circuit of claim 9, wherein the lock detector comprises:
first and second delay circuits;
first and second flip-flops coupled to the first and second delay circuits and to the output of the phase frequency detector; and
a logic gate coupled to outputs of the first and second flip-flops.

13. The PLL circuit of claim 9, wherein the sub-sampling phase detector comprises:
a pulser circuit;
a sampler coupled to the output of the VCO; and
a transconductance circuit coupled to an output of the sampler.

14. The PLL circuit of claim 9, wherein the loop filter comprises:

a first resistor coupled in series with a first capacitor;
a second capacitor coupled in parallel with the series combination of the first resistor and the first capacitor; and
a second resistor selectively coupled in parallel with the first resistor by a pair of switches.

15. The PLL circuit of claim 9, wherein the charge pump comprises:
first and second switches;
a first current source coupled between a supply voltage and the first switch; and
a second current source coupled between a reference voltage and the second switch.

16. The PLL circuit of claim 15, wherein outputs of the multiplexer circuit are coupled to control inputs of the first and second switches and the first and second current sources.

17. A method of operating a phase lock loop (PLL) circuit, comprising:
filtering output of a charge pump to control a voltage controlled oscillator (VCO);
generating first charge pump control signals using a phase frequency detector based on a frequency divided output of the VCO and a reference clock;
generating second charge pump control signals using a sub-sampling phase detector based on output of the VCO and the reference clock;
controlling the charge pump using the first control signals in a first mode; and
controlling the charge pump using the second control signals in a second mode after the first mode.

18. The method of claim 17, further comprising:
sampling the first control signals based on delayed versions of the divided output of the VCO and the reference clock; and
performing a logical NOR operation on samples of the first control signals to generate a control signal, the control signal selecting the first mode and then the second mode.

19. The method of claim 17, wherein the step of generating the second charge pump control signals comprises:
generating pulse signal based on the reference clock;
generating a differential voltage based on the reference clock and the output of the VCO; and
generating a differential current based on the differential voltage.

20. The method of claim 17, further comprising:
selecting a first resistance for a filter that filters the output of the charge pump during the first mode; and
selecting a second resistance for the filter during the second mode.

* * * * *